US010416249B2

(12) United States Patent
Burger et al.

(10) Patent No.: US 10,416,249 B2
(45) Date of Patent: Sep. 17, 2019

(54) ADAPTIVE PIN DIODE DRIVE CIRCUIT WITH MINIMIZED POWER LOSS

(71) Applicants: Walter Burger, Nürnberg (DE); Klaus Porzelt, Nürnberg (DE)

(72) Inventors: Walter Burger, Nürnberg (DE); Klaus Porzelt, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 1071 days.

(21) Appl. No.: 14/623,286

(22) Filed: Feb. 16, 2015

(65) Prior Publication Data
US 2015/0234020 A1 Aug. 20, 2015

(30) Foreign Application Priority Data

Feb. 17, 2014 (DE) .................. 10 2014 202 862

(51) Int. Cl.
*G01R 31/02* (2006.01)
*G01R 33/36* (2006.01)
*G01R 33/30* (2006.01)
*G01R 33/34* (2006.01)
*G01R 33/48* (2006.01)
*G01R 33/56* (2006.01)
G01R 33/3415 (2006.01)

(52) U.S. Cl.
CPC ....... *G01R 33/3664* (2013.01); *G01R 33/307* (2013.01); *G01R 33/34076* (2013.01); *G01R 33/3614* (2013.01); *G01R 33/3657* (2013.01); *G01R 33/4822* (2013.01); *G01R 33/5608* (2013.01); *G01R 33/3415* (2013.01)

(58) Field of Classification Search
CPC ............ G01R 33/3657; G01R 33/3664; G01R 33/3415; G01R 33/307; G01R 33/34076; G01R 33/5608; G01R 33/3614
USPC ......................................... 324/539
See application file for complete search history.

(56) References Cited

U.S. PATENT DOCUMENTS

| 6,323,648 | B1 * | 11/2001 | Belt .................. G01R 33/3415 |
| | | | 324/318 |
| 7,423,416 | B1 * | 9/2008 | Quinones ................. G05F 3/18 |
| | | | 323/314 |
| 2001/0028242 | A1 | 10/2001 | Bayer |
| 2005/0127914 | A1 | 6/2005 | Eberler et al. |
| 2009/0026840 | A1 | 1/2009 | Lenz |

(Continued)

FOREIGN PATENT DOCUMENTS

| DE | 10016168 A1 | 10/2001 |
| DE | 10314215 B4 | 11/2006 |

(Continued)

OTHER PUBLICATIONS

German Search Report for German Application No. 10 2014 202 862.0 dated Oct. 12, 2016.

*Primary Examiner* — Melissa J Koval
*Assistant Examiner* — Courtney G McDonnough
(74) *Attorney, Agent, or Firm* — Lempia Summerfield Katz LLC

(57) ABSTRACT

The embodiments relate to a method and to a device having at least one source, (in particular, having a source for a magnetic resonance imaging system), wherein the device is designed to select a supply voltage of the source on the basis of a load voltage of a load supplied with current and/or voltage from the source.

17 Claims, 8 Drawing Sheets

(56) References Cited

U.S. PATENT DOCUMENTS

| | | | | |
|---|---|---|---|---|
| 2012/0176195 A1* | 7/2012 | Dawson | ................ | H03F 1/0244 |
| | | | | 330/124 R |
| 2013/0134978 A1* | 5/2013 | Biber | ................ | G01R 33/3875 |
| | | | | 324/320 |
| 2013/0241556 A1 | 9/2013 | Schnell | | |
| 2014/0253062 A1* | 9/2014 | Qin | ........................... | G05F 1/10 |
| | | | | 323/271 |
| 2015/0015262 A1* | 1/2015 | Greim | ................ | G01R 33/3642 |
| | | | | 324/322 |

FOREIGN PATENT DOCUMENTS

| | | |
|---|---|---|
| DE | 102007026912 A1 | 12/2008 |
| DE | 102011082256 B3 | 2/2013 |
| DE | 102013213377 B3 | 7/2014 |

* cited by examiner

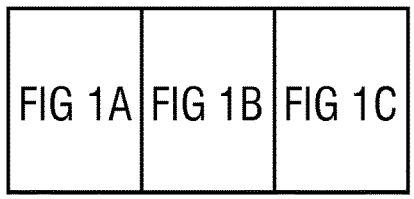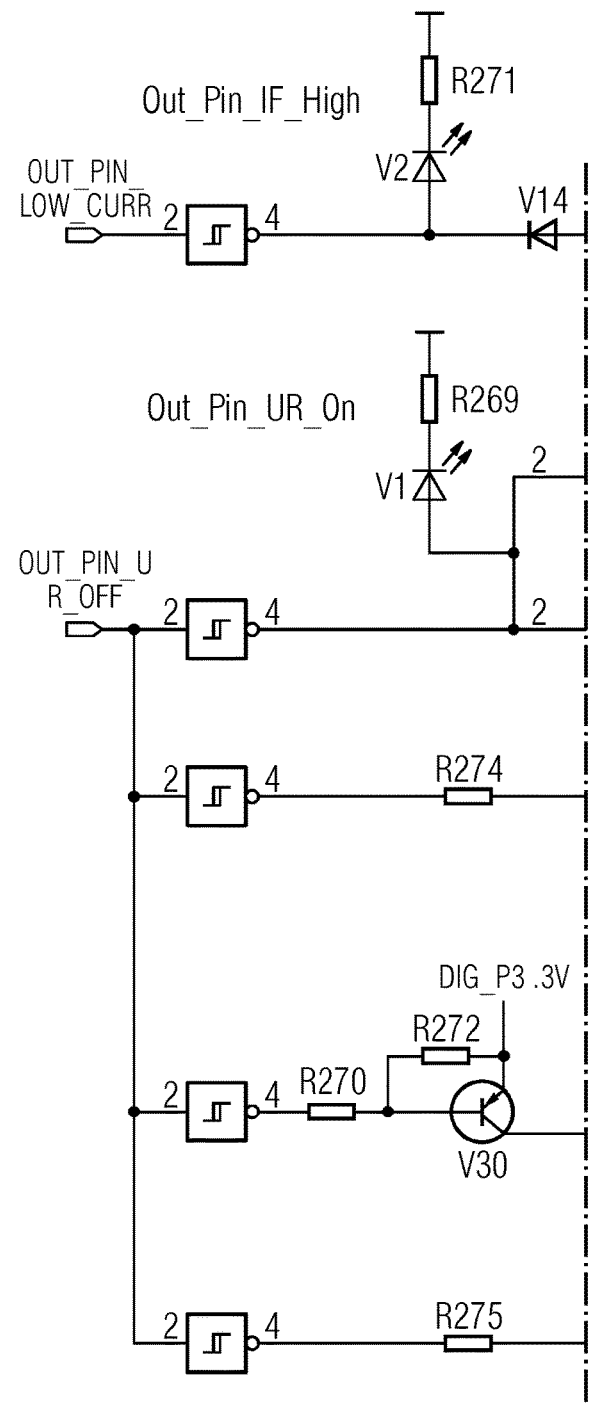

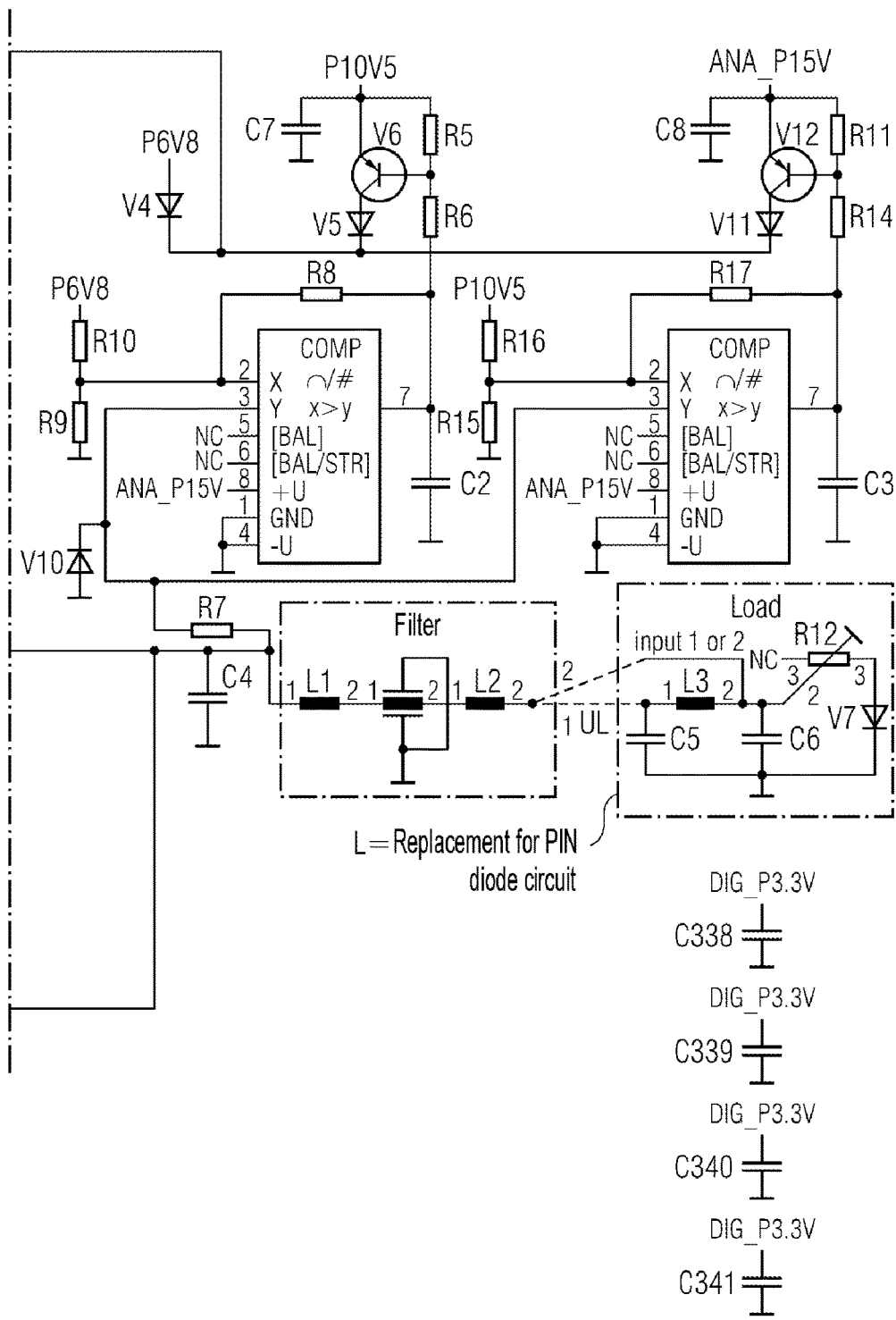

ADAPTIVE PIN DIODE DRIVE CIRCUIT WITH MINIMIZED POWER LOSS

CROSS-REFERENCE TO RELATED APPLICATIONS

This application claims the benefit of DE 10 2014 202 862.0, filed on Feb. 17, 2014, which is hereby incorporated by reference in its entirety.

TECHNICAL FIELD

The embodiments relate to devices and methods for PIN diode drive circuits.

BACKGROUND

Magnetic resonance apparatuses (MRIs) for examining objects or patients by magnetic resonance imaging are known, for example, from DE 103 14 215 B4. PIN diode drive circuits for MRI local coils are described, for example, in DE 10 2013 213 377 A1.

SUMMARY

The scope of the present invention is defined solely by the appended claims and is not affected to any degree by the statements within this summary. The present embodiments may obviate one or more of the drawbacks or limitations in the related art.

One problem addressed in the present embodiments is to optimize a MRI, in particular, the PIN diode drive circuit thereof. The embodiments relate to a method and to a device having at least one source, (in particular, having a source for a magnetic resonance imaging system), wherein the device is designed to select a supply voltage of the source on the basis of a load voltage of a load supplied with current and/or voltage from the source.

BRIEF DESCRIPTION OF THE DRAWINGS

FIGS. 1A, 1B, and 1C depict an example of an adaptive PIN diode drive circuit with minimized power.

DETAILED DESCRIPTION

Figure 4:
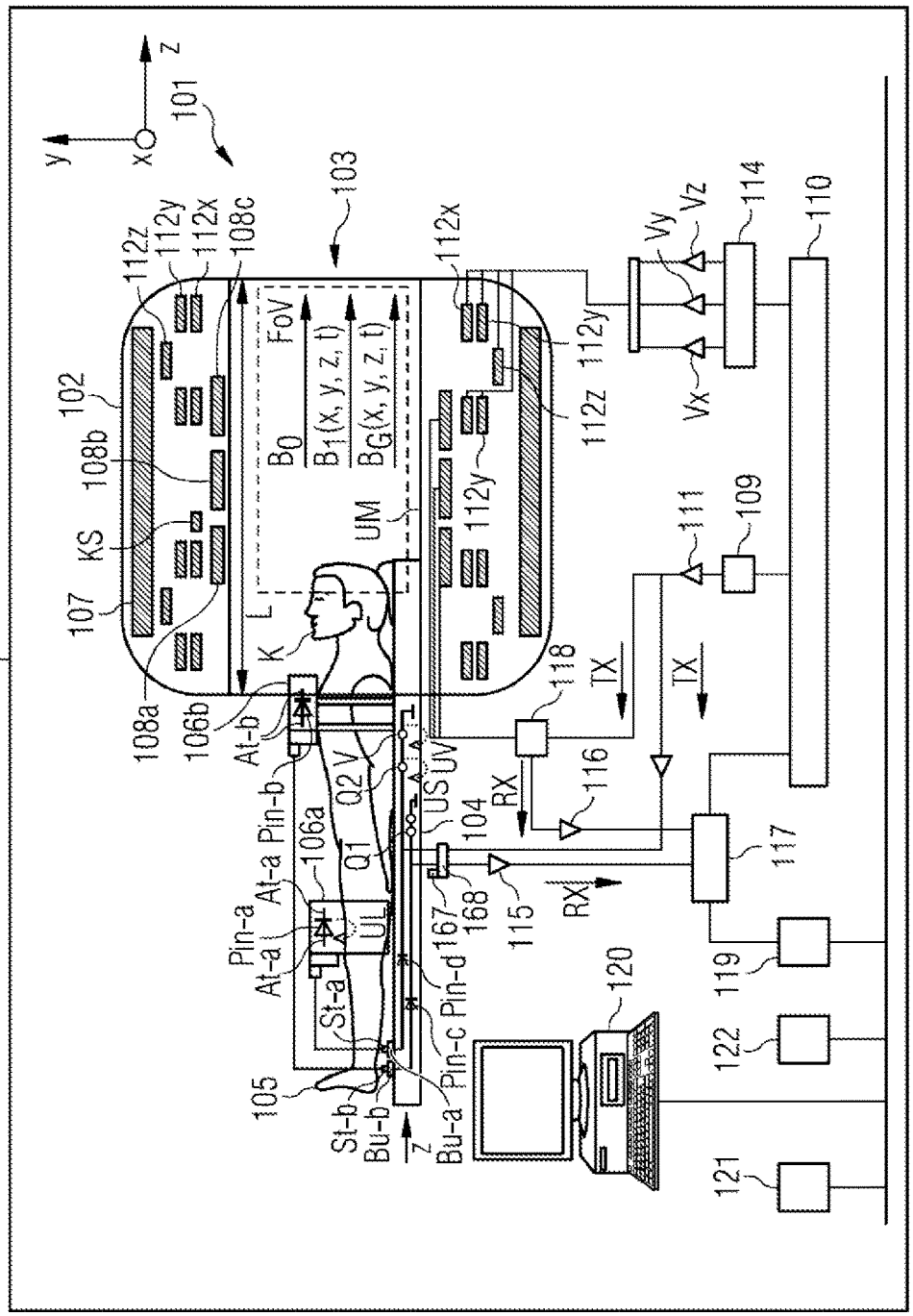
FIG. 4 schematically depicts an example of a MRI system.

FIG. 4 depicts an imaging magnetic resonance apparatus MRI 101 (located in a shielded room or Faraday cage F) having a hollow cylinder 102 with a space 103, (e.g., a tubular space). A patient couch 104 having a body or an object for examination 105, (e.g., a patient) with or without local coil 106a, 106b, may be moved in the space 103 in the direction of the arrow z in order to generate images of the patient 105 using an imaging method. In this case, a local coil 106 is arranged on the patient 105, by virtue of which local coil, in a local area (also referred to as field of view or FOV) of the MRI, images of a partial region of the body 105 in the FOV may be generated. Signals from a local coil 106a, 106b (such as from the knee local coil 106a or from the chest-area local coil 106b in this case) may be evaluated (for example, converted into pictures, stored, or displayed) by an evaluation device (168, 115, 117, 119, 120, 121 etc.) of the MRI 101. The evaluation device is connectable, for example, via a coaxial cable or by radio link 167, etc., to a local coil 106a, 106b.

In order to examine a body 105 (e.g., an object for examination or a patient) using a magnetic resonance apparatus MRI 101 by magnetic resonance imaging, various magnetic fields that are precisely matched to one another in terms of their temporal and spatial characteristics are radiated onto the body 105. A strong magnet (e.g., a cryomagnet 107) in a measurement cabin with an opening 103 that is tunnel-shaped in this case generates a strong static main magnetic field $B_0$, which has a strength of, for example, 0.2 Tesla to 3 Tesla or even more. A body 105 to be examined is, while supported on a patient couch 104, moved into a region of the main magnetic field $B_0$ that is approximately homogeneous in the observation region FOV ("Field of View"). The nuclear spins of atomic nuclei of the body 105 are excited by magnetic radiofrequency excitation pulses $B1(x, y, z, t)$ that are radiated in by a radiofrequency antenna (and/or, optionally, a local coil), which is depicted here as a (e.g., multi-part=—108a, 108b, 108c) body coil 108. By way of example, radiofrequency excitation pulses TX are generated by a pulse generation unit 109, which is controlled by a pulse sequence control unit 110. After amplification by a radiofrequency amplifier 111, the radiofrequency excitation pulses TX are conducted to a radiofrequency antenna 108a, 108b, 108c and/or local coils 106a and/or 106b. The radiofrequency system depicted here is indicated schematically. In a magnetic resonance apparatus 101, use is possibly also made of more than one pulse generation unit 109, more than one radiofrequency amplifier 111, and several radiofrequency antennas 108a, b, c (and, optionally, in local coils 106a, 106b).

The magnetic resonance apparatus 101 furthermore includes gradient coils 112x, 112y, 112z, by which magnetic gradient fields $B_G(x, y, z, t)$ are radiated in during a measurement for selective slice excitation and for spatial encoding of the measurement signal. The gradient coils 112x, 112y, 112z are controlled by a gradient coil control unit 114 and, optionally, via amplifiers Vx, Vy, Vz, which, like the pulse generation unit 109, is connected to the pulse sequence control unit 110.

Signals RX emitted by the excited nuclear spins (e.g., of the atomic nuclei in the object for examination) are received by the body coil 108 and/or at least one local coil 106a, 106b, amplified by associated radiofrequency preamplifiers 116 and processed further and digitized by a receiving unit 117. The recorded measurement data are digitized and stored as complex numbers in a k-space matrix. An associated MR image may be reconstructed from the k-space matrix filled with values by a multidimensional Fourier transform.

For a coil that may be operated both in transmission mode and in reception mode, (for instance, the body coil 108 or a local coil 106a, 106b), the correct signal transmission is regulated by an upstream transmission/reception switch 118.

An image processing unit 119 generates an image from the measurement data, which image is displayed to a user by an operating console 120 and/or stored in a storage unit 121. A central computer unit 122 controls the individual installation components.

In MR imaging, images with a high signal-to-noise ratio (SNR) may be recorded these days using so-called local coils (coils). These are antenna systems that are attached in the direct vicinity on (anterior) the body 105, under (posterior) the body 105, at the body 105, or in the body 105. During a MR measurement, the excited nuclei induce a voltage in the individual antennas of the local coil, which voltage is then amplified using a low-noise preamplifier (e.g., LNA, preamp) and finally transmitted to the reception electronics. In order to improve the signal-to-noise ratio even in the case of high resolution images, use is made of so-called high-field installations (e.g., 1.5 T-12 T or more). If more individual antennas may be connected to a MR reception system than receivers are available, a switching matrix (also sometimes referred to as RCCS), for example, is installed between reception antennas and receivers. The matrix routes the currently active reception channels (e.g., those channels that currently lie in the field of view of the magnet) to the available receivers. As a result, it is possible to connect more coil elements than receivers are available because, in the case of a whole body cover, it is only necessary to read those coils situated in the FOV (field of view) or in the homogeneous volume of the magnet.

By way of example, an antenna system may include, for example, of one antenna element or, as an array coil, of several antenna elements (in particular, coil elements). Such an antenna system may be referred to as local coil 106a, 106b. By way of example, these individual antenna elements are embodied as loop antennas (loops), butterfly coils, flex coils, or saddle coils. By way of example, a local coil 106a, 106b includes coil elements (e.g., antennas At-a, At-b), a preamplifier, further electronics (e.g., standing wave traps, etc.), a housing, supports, and optionally a cable or, for example, a bunched cable with a plug St-a, St-b, by which it is connected to (connections/sockets Bu-a, Bu-b on, for example, the patient couch 104 for) the MRI installation 101. A receiver 168 attached to the installation side filters and digitizes signals RX received from a local coil 106a, 106b, for example, by radio link, etc., and transmits the data to a digital signal processing device, which may derive an image or a spectrum from the data obtained by a measurement and makes this available to the user, for example, for the subsequent diagnosis by the user and/or for storing.

FIGS. 1-6 depict details of exemplary embodiments of adaptive PIN diode drive circuits for one or more local coils 106a, 106b with minimized power loss.

In the case of at least internally known embodiments, different antenna elements may be able to be rapidly (e.g., lower than approximately 50 microseconds) switched with sequence synchronicity between tune (e.g., transmitting and/or receiving) and detune (e.g., not transmitting and/or not receiving) during MR measurements. For this purpose, in the case of at least internally known embodiments, PIN diodes PIN-a, PIN-b, PIN-c, PIN-d (e.g., PIN-a, PIN-b in the local coil or, in this case, for example, PIN-c, PIN-d in a controller or circuit in the MRI 101 or in the patient couch 104) are used as RF switches. The switchover may not impair the MR system, in particular, no RF interferences may arise, and the switching electronics may function in the stray field of the MR magnet in an unrestricted manner.

Figure 5:
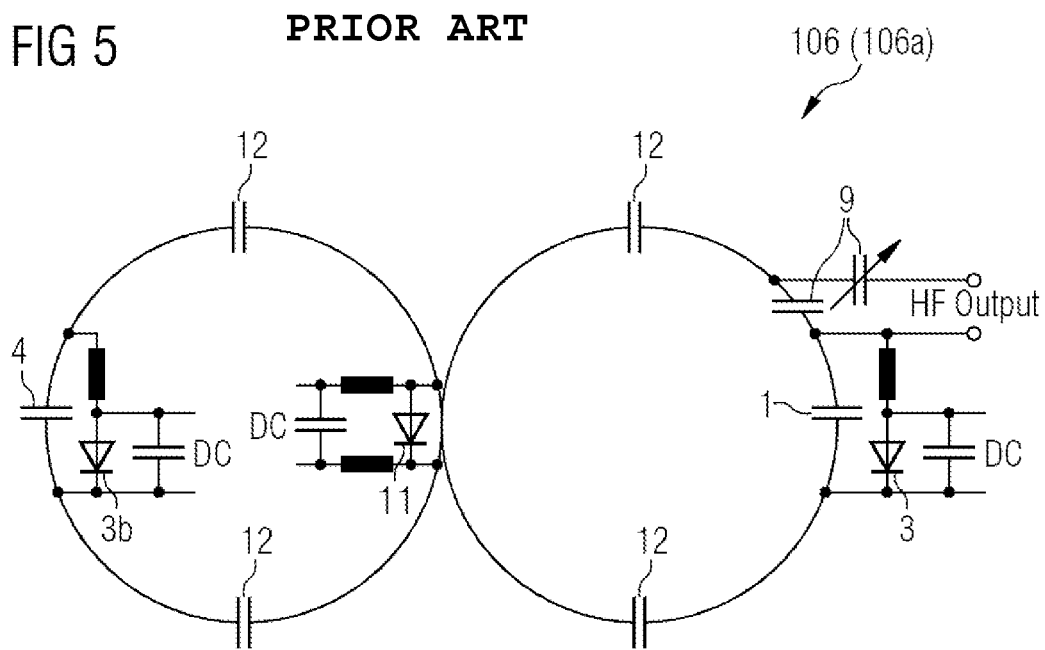
FIG. 5 schematically depicts driven PIN diodes for antennas of local coils for a MRI system according to DE 10 2013 213 377 A1.

PIN diode drive circuits such as these for MRI local coils (such as local coils 106a, 106b) are generally described in DE 10 2013 213 377, for example, from which the present FIG. 5 is taken to illustrate the prior art. FIG. 5 depicts an antenna of a local coil 106a, 106b, in which in each case one or more of the PIN diodes 3, 3b, 11 may be energized optionally by sources Q1, Q2, V34, V204 in order to switch the antenna in the region of the PIN diodes so as to conduct radiofrequency, or in each case, one of the PIN diodes 3a, 3b, 11 may have a reverse voltage applied thereto by sources in order to switch the antenna in the region of the PIN diodes so as to block radiofrequency.

In certain embodiments, switchable analog current and voltage sources have been used.

Figure 1B:
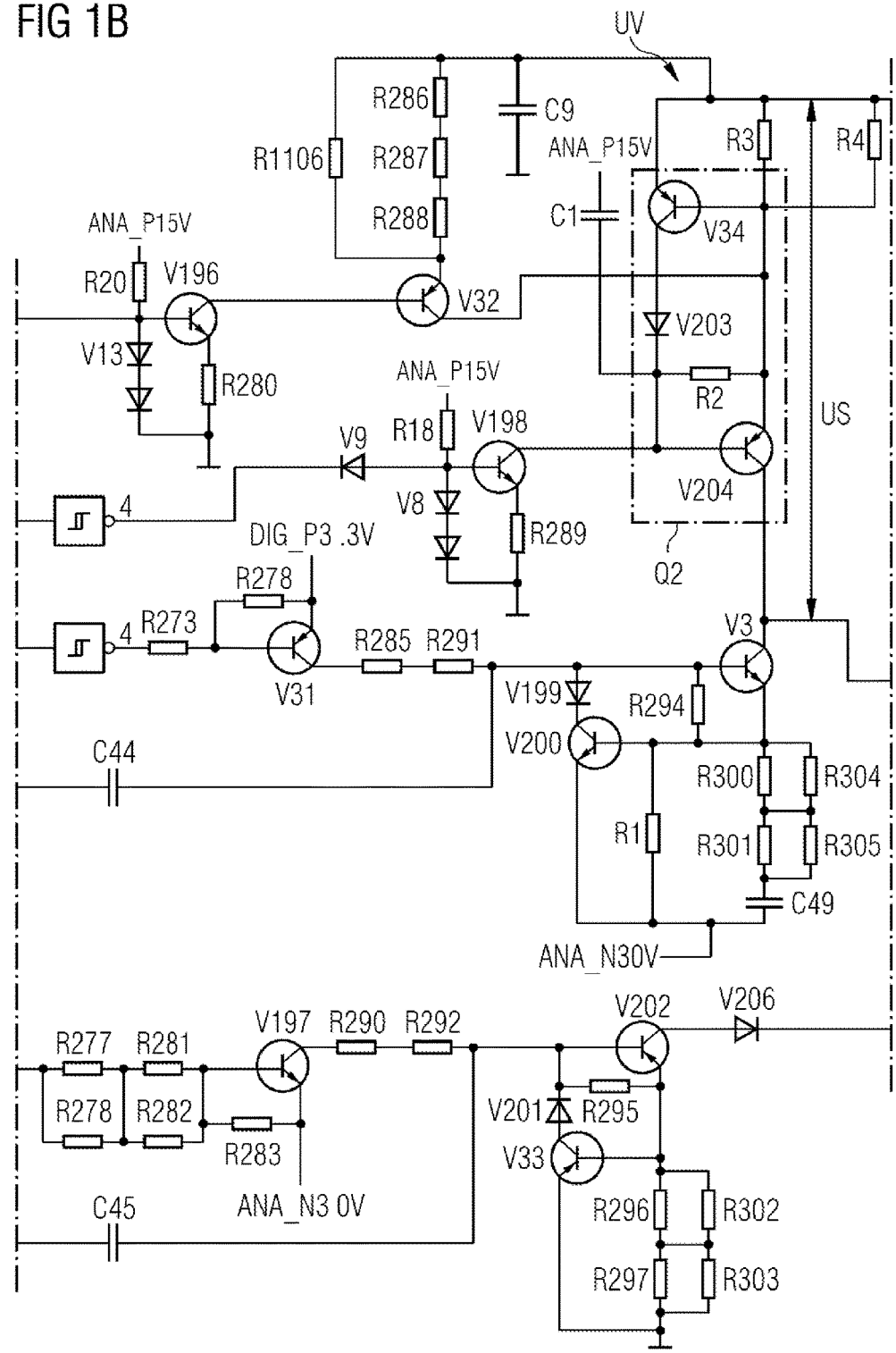

A PIN diode, (e.g., PIN diodes PIN-a, PIN-b, PIN-c, PIN-d indicated in FIG. 4) energized (having current from a current and voltage source Q1, Q2, V34, V204) applied thereto) as in FIG. 1, is highly conductive with reference to radiofrequency (e.g., the RF voltage present), and is highly resistive in the case of a reverse voltage being applied.

Various local coils 106a, 106b etc. may be connected (to a magnetic resonance imaging apparatus, for example, via plug connections St-a, St-b, Bu-a, Bu-b on a patient couch 104, and via these) to a PIN diode channel (having in each case at least one PIN diode PIN-a, PIN-b, PIN-c, PIN-d). The voltage drop of each PIN diode channel in the current mode may be very different, depending on the load connected (for example, in (the form of) the local coil 106a, 106b connected thereto). In addition, the voltage drop may fluctuate during running operation, for example, owing to temperature dependences.

Sources Q1, Q2, V34, V204 in the form of, for example, constant current sources may be configured such that they supply a constant current from short-circuit up to the maximum required consumer voltage.

Depending on the wiring, a source Q1, Q2, V34, V204 (e.g., in the form of a constant current source) requires an individual voltage drop US. Therefore, the supply voltage UV (from a supply V of the source Q) thereof (e.g., present across the source Q1, Q2, V34, V204 for supplying the source Q1, Q2, V34, V204) may be greater by US than the load voltage UL occurring at maximum (e.g., owing to the load) in the case of a fixedly impressed current.

At present, embodiments of constant current sources are supplied, for example, with +15 V and may cover load voltages of from 0 V to 13 V. Once the output current is constant, the variable generated power loss depends only on the difference between supply voltage UV and load voltage UL. The fixed portion results from the constant current multiplied by the required voltage drop US of the constant current source. In most cases of operation, the load-dependent variable power loss portion dominates. Dissipating the power loss may already generate a significant expenditure under the conditions in a MR installation (e.g., magnetic field, gradient field, RF shielding, lack of space).

A supply voltage UV for one or more current sources for a MRI may be selected on the basis of the load voltage UL of the connected consumer.

For this purpose, there are various possible configurations. According to one embodiment, the information relating to which local coil 106a, 106b is presently connected to which plug-in location (e.g., on the patient couch) is available in the MR system (e.g., in a controller 110 and/or a memory of the MRI 101). Thus, the maximum load voltage UL for each of the constant current sources connected, for example, per plug-in location, may be obtained from an assignment table stored, for example, in the controller 110. Each constant current source is generated or supplied only with the minimum required supply voltage UV=UL+Us. Thus, the power loss may be reduced to a minimum. An assignment table such as this may be an extension of the present at least internally known so-called coil files (e.g., a file, stored centrally 110 in the MRI 101, relating to properties of local coils that may be used and, when connected, detected by the MRI 101). By way of example, 15 V, 12 V, 9 V and 6 V may be made available as variable supply voltages UV for (e.g., constant current) sources Q1, Q2, V34, V204.

According to another embodiment, after a local coil has been plugged in, the possible plurality of constant current sources automatically calculate which supply voltage they need in order to be able to supply the constant current IL (suitable for the load, for example, in a plugged-in and detected local coil). This value is stored and, for example, only recalculated in the event of a subsequent coil change of a local coil for another local coil.

According to yet another embodiment, the (e.g., constant current) sources Q1, Q2, V34, V204 automatically continuously calculate during a running MR sequence (e.g., while the MRI 101 sends a RF sequence) which supply voltage UV they require in order (in this case, taking into account their own voltage drop US) to be able to supply the (e.g., suitable/required) constant current and/or voltage UL to maintain the constant current and connect the appropriate supply voltage UV (e.g., of the source).

Possible advantages of embodiments described herein may be that the power loss in the (e.g., constant current) sources Q1, Q2, V34, V204 may be minimized owing to the variable supply voltage UV, that the expenditure required for cooling may be significantly reduced and that the degrees of freedom for mechanical accommodation of the constant current sources may be increased.

Figure 2:
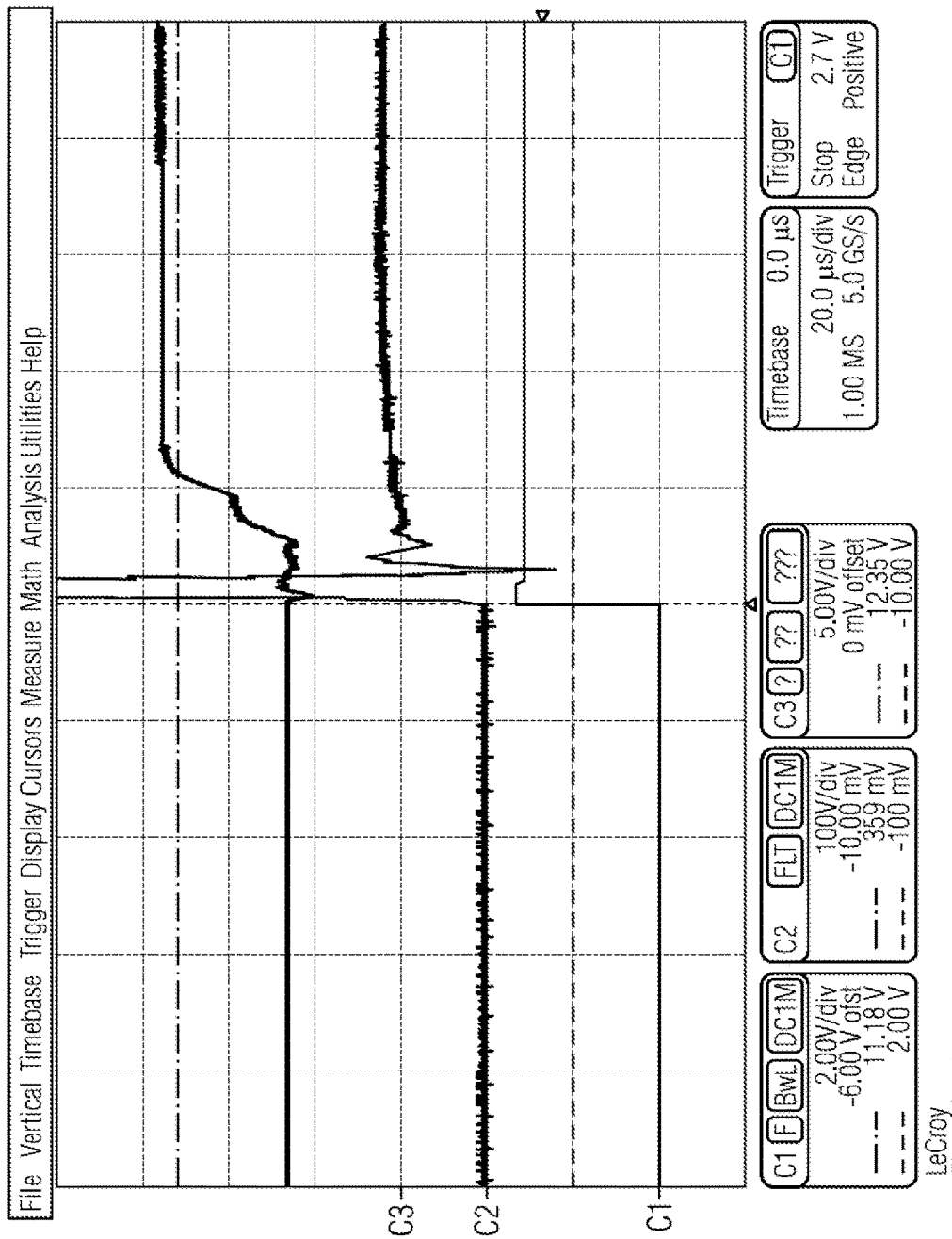
FIG. 2 depicts current and voltage profiles when switching an adaptive PIN diode drive circuit with minimized power loss according to FIG. 1.

In the exemplary embodiment in FIG. 1 (and partially correspondingly in the exemplary embodiment in FIG. 2), the current source formed by V34 and V204 obtains its supply voltage UV of 6.8 V, 10.5 V or 15 V at the emitter of V34. A supply voltage UV of 6.8 V is present (e.g., during the operation of the local coil). Supply voltages UV of 10.5 V or 15 V are, in each case, instead connected to a source Q1, Q2, V34, V204 if the output voltage of the current source approaches the limit up to which a current regulation (which is necessary for the load) is still possible. A voltage of 10.5 V is connected via V6 by the comparator J1 if a voltage of 6.8 V is no longer sufficient. A voltage of 10.5 V or 15 V is connected via V12 by the comparator J2 if the voltage of 10.5 V is no longer sufficient, either. The present output voltage is supplied via R7 to the voltage divider R9/R10. The voltage divider and the wiring of the comparators are configured such that at least 2.5 V remain available to the current source for correction purposes. The maximum voltage dropping across the current source is given by 6.8 V in the event of a short circuit at the output. In all other cases of operation, the voltage dropping across the current source is between 2.5 V and 6.8 V. Without the adaptive supply voltage selection, the maximum voltage US dropping across the current source would be 15 V in the event of a short circuit at the output. In the regulating mode, a voltage of 15 V would be minus the voltage UL dropping across the consumer. By way of example, in the most unfavorable case, the power loss generated at the current source is reduced to 6.8:15=45.3% and, in a standard mode with different loads, to approximately 20%. The more accurate the selection of supply voltages, the greater the reduction in the power loss.

In this case, a switching hysteresis is realized via R8 and/or R17 in order to provide stable operation.

FIG. 2 depicts by way of example a temporal profile of signals.

FIG. 2 illustrates the following signals. Channel 1 (C1) is a switchover signal, where low is a voltage mode, and high is a current mode of a source. Channel 2 (C2) corresponds to the current (measured as a voltage drop across 1 Ohm) at the output of a constant current source. Channel 3 (C3) is the connected supply voltage UV for a constant current source.

FIG. 2 depicts the signal profiles if the load (e.g., in a local coil) already requires a supply voltage of 15 V. In this case, firstly, a voltage of 10.5 V is connected at approximately 11 microseconds (µs), then a voltage of 15 V is connected at approximately 19 microseconds. This supply voltage UV is stably achieved in this case at approximately 27 microseconds (µs). The output current of the source Q1, Q2, V34, V204 is stable after approximately 30 microseconds (µs) in this case. The current source built up in this example supplies a nominal current of 108 mA.

The principle of adaptive switching of a supply voltage may, in principle, be used for all sources Q1, Q2, V34, V204 that have a variable output voltage, e.g., regulated voltage sources with so-called sense line or adjustable voltage and current sources. Compared to a fixedly supplied regulator, a marked reduction in the power loss may be made possible. This may be of advantage wherever a low power loss is expedient but a clocked regulator may not be used or rather only with greater difficulty. The concrete application described here is the PIN diode drive circuit of (e.g., PIN diodes in) local coils of a MR installation.

Figure 3:
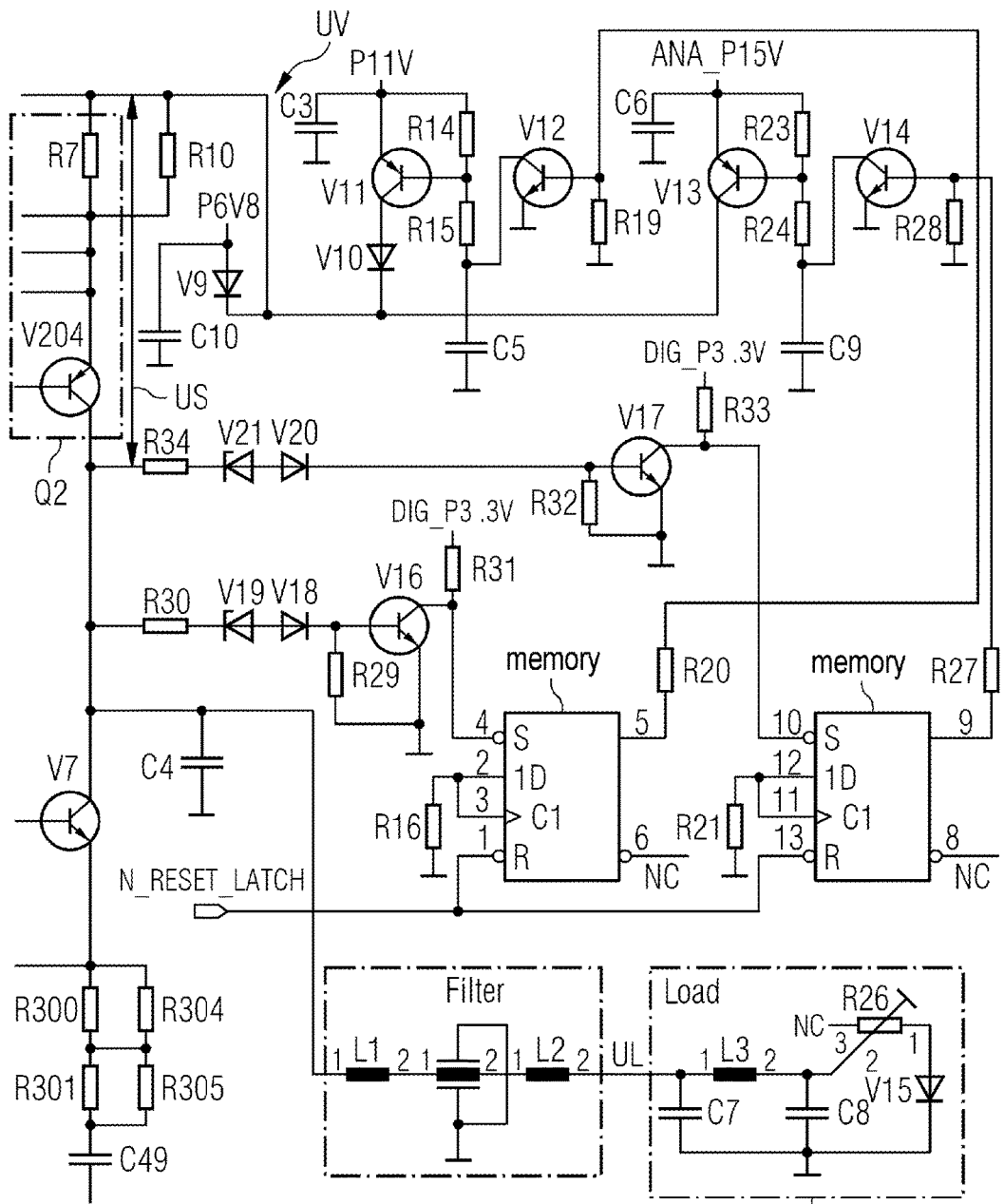
FIG. 3 depicts a further example of an adaptive PIN diode drive circuit with minimized power loss.

FIG. 3 illustrates an example of adaptive switching of a supply voltage with storage (as described above with respect of a further exemplary embodiment).

The circuit illustrated here in FIG. 3 functions in a similar manner to that described above (with respect to FIG. 2). In this case, however, a required supply voltage UL for a load or the present operation thereof or the presently transmitted RF sequence etc., once calculated, is stored (by, for example, 74LVC74 or J2-2 and output via R27) until a higher supply voltage UL is required. This provides a quicker rise in the current because the appropriate supply voltage may be immediately accessed. In the event of each determined coil change (by another local coil plugged into a plug-in location on the MRI 101), reset automatically occurs here and the necessary supply voltage is calculated once again.

Figure 6:
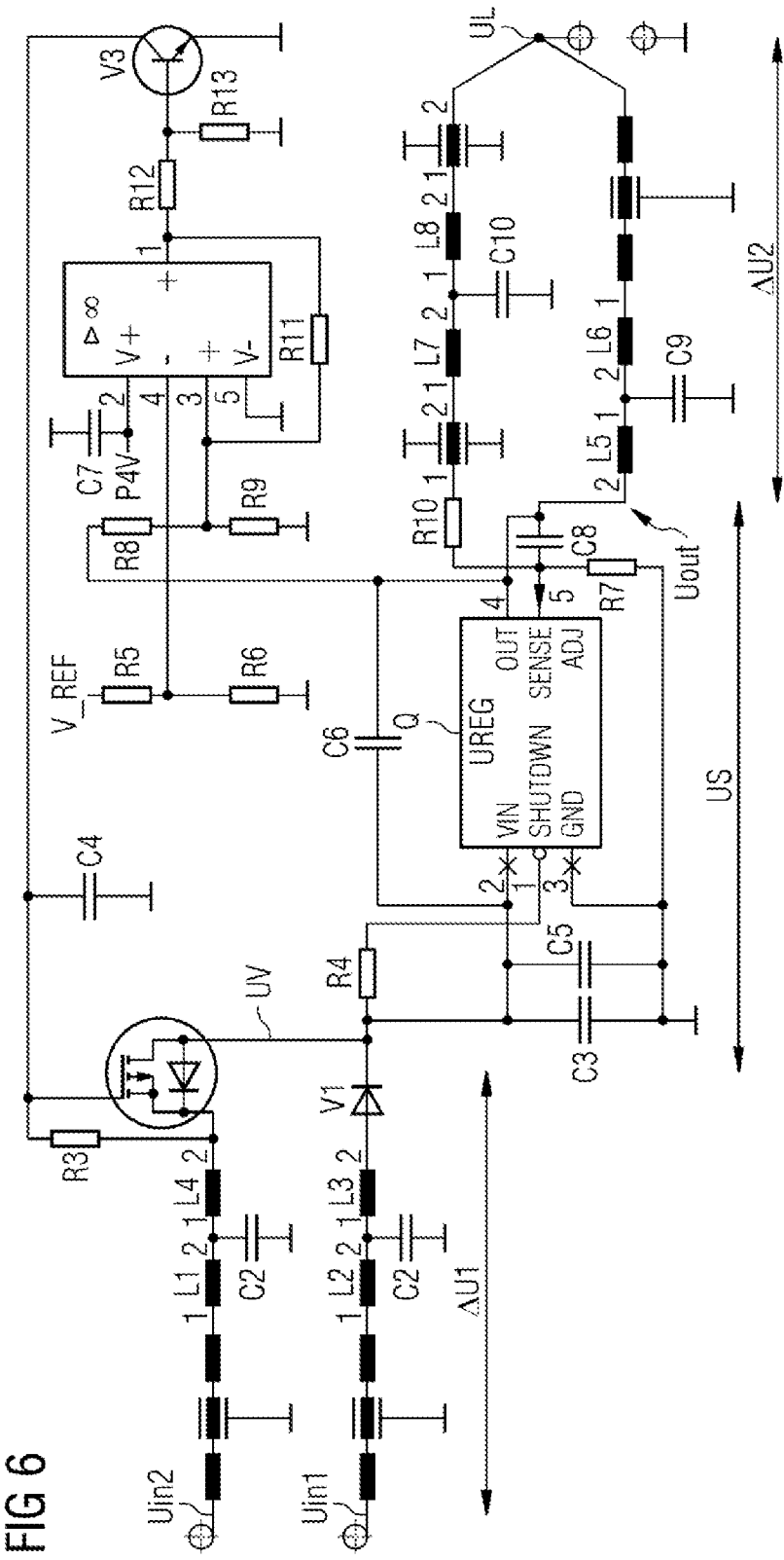
FIG. 6 depicts an example of a configuration.

The source Q in FIG. 6 is a voltage source that keeps the load voltage UL constant using a sense line. In the event of increasing loading, the voltage drops ΔU1 and ΔU2 in the lines and in the filter circuits become so large that US is no longer sufficient for the source. The minimum necessary voltage US corresponds to the dropout voltage of the regulator used. In order to prevent correction from no longer being made, the source output voltage is measured and, in the event of a threshold being exceeded, the next-highest voltage is connected as input voltage UV to the source via the comparator. A further possibility may include in measuring the output current and switching the input voltage on the basis of the output current.

By virtue of the switching, the power loss in the source is minimized.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance imaging (MRI) system comprising:
    at least one local coil having at least one PIN diode;
    a radiofrequency (RF) switch connected to the at least one local coil via the at least one PIN diode, the PIN diode configured to switch between tuning and detuning of the local coil during a magnetic resonance measurement; and
    at least one source,
    wherein the MRI system is configured to select a supply voltage from a plurality of selectable supply voltages of the at least one source based on a load voltage of the RF switch to supply a variable supply voltage to the at least one local coil,
    wherein the MRI system is configured to adaptively switch between the plurality of selectable supply voltages during the magnetic resonance measurement to minimize power loss,
    wherein the RF switch is supplied with current, voltage, or the current and the voltage from the at least one source, and
    wherein the RF switch is connected or connectable to the at least one source.

2. The MRI system of claim 1, wherein the at least one source comprises one or more of the following: a constant current source, a constant voltage source, an adjustable voltage source, or an adjustable current source.

3. The MRI system of claim 1, wherein the MRI system is configured to:
    (1) determine, using an item of information transmitted from the at least one local coil to a controller of the MRI system, which local coil is currently connected to which plug-in location of the MRI system,
    (2) determine, using an assignment table, the maximum load voltage for each local coil connected to a plug-in location of the MRI system, one or more PIN diodes in the local coil, or the plug-in location and the one or more PIN diodes,
    (3) apply, to the source, the supply voltage of the source based on the load voltage of the load in the local coil, voltage drop of the source, or the load voltage and the voltage drop.

4. The MRI system of claim 1, wherein the plurality of selectable supply voltages comprise more than two selectable supply voltages.

5. The MRI system of claim 1, wherein the plurality of selectable supply voltages comprise more than three selectable supply voltages.

6. The MRI system of claim 1, wherein the at least one source is a constant current source configured such that, after plugging into a local coil, the at least one source automatically calculates a supply voltage value required to supply the constant current for the local coil, the PIN diode, or the local coil and the PIN diode.

7. The MRI system of claim 6, wherein the supply voltage is stored and is only calculated again during a next local coil change.

8. A device comprising:
    a radiofrequency (RF) switch comprising at least one PIN diode connected to at least one local coil, the PIN diode configured to switch between tuning and detuning of the local coil during a magnetic resonance measurement; and
    at least one source for a magnetic resonance (MR) imaging system,
    wherein the device is configured to select a supply voltage from a plurality of supply voltages of the at least one source based on a load voltage of a load supplied with current, voltage, or current and voltage from the at least one source to supply a variable supply voltage to the at least one local coil,
    wherein the at least one source is a constant current source configured to:
    (1) continually automatically calculate, during a running MR sequence emission of the magnetic resonance imaging system, the supply voltage required to supply a required constant current for the local coil connected thereto, one or more PIN diodes of the local coil, or the local coil and the one or more PIN diodes, and
    (2) adaptively switch the appropriate supply voltage of the plurality of supply voltages during a MR measurement to minimize power loss.

9. The MRI system of claim 1, wherein a first supply voltage of the plurality of supply voltages is present at an emitter of a current source, and a second supply voltage of the plurality of supply voltages is respectively connected in if an output voltage of the current source approaches a limit up to which the required current regulation is still possible for the load.

10. The MRI system of claim 1, wherein a second supply voltage of the plurality of supply voltages is connected in by a comparator when the supply voltage is no longer sufficient, and a third supply voltage of the plurality of supply voltages is connected in by an additional comparator when the second supply voltage is not sufficient either.

11. The MRI system of claim 1, wherein the at least one source is a current source,
    wherein the supply voltage of the plurality of supply voltages currently generated by the current source is present across a resistor at a voltage divider, and
    wherein the voltage divider and wiring of comparators are configured such that at least 2.5 V remain available to the current source for correction purposes.

12. The MRI system of claim 1, wherein a maximum voltage dropping across the current source is 6.8 V in the event of a short circuit at an output.

13. The MRI system of claim 1, wherein the voltage dropping across the current source is between 2.5 V and 6.8 V.

14. The MRI system of claim 1, wherein the RF switch provides a switching hysteresis in order to provide stable operation.

15. The MRI system of claim 1, wherein a calculated required supply voltage is stored until a higher supply voltage becomes necessary.

16. The MRI system of claim 1, wherein the device is configured such that, in the event of a local coil being exchanged for another local coil, the supply voltage is calculated once again.

17. A method for operating a current source, voltage source, or current and voltage source during a magnetic resonance (MR) measurement, the method comprising:
    selecting a supply voltage from a plurality of supply voltages of the current source, the voltage source, or the current and the voltage source based on a load voltage of a load supplied with current, voltage, or current and voltage from the current source, the voltage source, or the current and the voltage source, to supply a variable supply voltage to at least one local coil of a plurality of local coils;

determining, using an item of information transmitted from the at least one local coil to a controller of a magnetic resonance imaging system, which local coil of the plurality of local coils is currently connected to which plug-in location of the magnetic resonance imaging system;

determining, using an assignment table, a maximum load voltage for each local coil connected to one or more PIN diodes in the local coil;

applying, to the source, the supply voltage of the source based on the load voltage of the load in the local coil, voltage drop of the source, or the load voltage and the voltage drop; and adaptively switching between the plurality of selectable supply voltages during the MR measurement to minimize power loss.

* * * * *